United States Patent
Lee

(10) Patent No.: US 8,980,662 B2
(45) Date of Patent: Mar. 17, 2015

(54) METHOD OF FABRICATING ORGANIC LIGHT EMITTING DIODE DISPLAY DEVICE

(75) Inventor: Se-Hee Lee, Jung-ri (KR)

(73) Assignee: LG Display Co., Ltd., Seoul (KR)

( * ) Notice: Subject to any disclaimer, the term of this patent is extended or adjusted under 35 U.S.C. 154(b) by 332 days.

(21) Appl. No.: 13/333,536

(22) Filed: Dec. 21, 2011

(65) Prior Publication Data

US 2012/0164772 A1    Jun. 28, 2012

(30) Foreign Application Priority Data

Dec. 27, 2010  (KR) ................ 10-2010-0135537

(51) Int. Cl.

| | |
|---|---|
| *H01L 51/56* | (2006.01) |
| *C23C 14/04* | (2006.01) |
| *C23C 14/12* | (2006.01) |
| *C23C 14/24* | (2006.01) |
| *H01L 51/00* | (2006.01) |
| *H01L 51/50* | (2006.01) |
| *H01L 51/52* | (2006.01) |

(52) U.S. Cl.
CPC .............. *C23C 14/042* (2013.01); *C23C 14/12* (2013.01); *C23C 14/243* (2013.01); *H01L 51/0011* (2013.01); *H01L 51/0037* (2013.01); *H01L 51/5064* (2013.01); *H01L 51/5265* (2013.01); *H01L 2227/323* (2013.01)
USPC .......................................................... 438/34

(58) Field of Classification Search
USPC .......................................................... 438/34
See application file for complete search history.

(56) References Cited

U.S. PATENT DOCUMENTS

| | | | | |
|---|---|---|---|---|
| 3,639,125 | A * | 2/1972 | Chand | 430/353 |
| 2007/0024183 | A1* | 2/2007 | Lih et al. | 313/504 |
| 2007/0236134 | A1* | 10/2007 | Ho et al. | 313/500 |
| 2009/0176010 | A1* | 7/2009 | Zwick et al. | 427/78 |
| 2010/0060156 | A1* | 3/2010 | Fukuda et al. | 313/504 |
| 2010/0117527 | A1* | 5/2010 | Ho et al. | 313/504 |
| 2010/0159165 | A1* | 6/2010 | Ueda et al. | 428/32.8 |

FOREIGN PATENT DOCUMENTS

CN    101916824 A    12/2010

OTHER PUBLICATIONS

Office Action issued in corresponding Chinese Patent Application No. 201110455405.0, mailed Jan. 16, 2014, 19 pages.
Safety Data Sheet, Sigma-Aldrich, version 5.5, revision date Mar. 8, 2014, print date Jul. 14, 2014, 6 pages.
Office Action issued in Taiwanese Patent Application No. 100143958, mailed Jul. 21, 2014, 11 pages.

* cited by examiner

*Primary Examiner* — Charles Garber
*Assistant Examiner* — Stanetta Isaac
(74) *Attorney, Agent, or Firm* — Brinks Gilson & Lione

(57) ABSTRACT

A method of forming an organic luminescent layer includes: sequentially disposing a shadow mask and a substrate over disposing at least one crucible having first and second organic materials therein; and heating up the first and second organic materials to form the organic luminescent layer on the substrate, wherein the second organic material has one of a heat capacity smaller than the first organic material and a sublimableness.

12 Claims, 10 Drawing Sheets

METHOD OF FABRICATING ORGANIC LIGHT EMITTING DIODE DISPLAY DEVICE

This application claims the priority and the benefit under 35 U.S.C. §119(a) on Patent Application No. 10-2010-0135537 filed in Republic of Korea on Dec. 27, 2010, the entire contents of which are hereby incorporated by reference.

BACKGROUND

1. Field of the Invention

The present disclosure relates to an organic light emitting diode (OLED) display device, and more particularly, to a method of fabricating an organic light emitting diode (OLED) display device where deterioration of a shadow mask is prevented.

2. Discussion of the Related Art

Among various flat panel display devices (FPDs), an organic light emitting diode (OLED) display device has a relatively high brightness and a relatively low driving voltage. In addition, since the OLED display device has an emissive type emitting a light for itself, the OLED display device has a relatively high contrast ratio and a relatively thin profile. The OLED display device has an advantage in displaying moving images due to a response time of several microseconds. Further, the OLED display device has no limitation in a viewing angle and has stability even at a low temperature. Since the OLED display device is driven with a low voltage of direct current (DC) 5V to DC 15V, it is easy to design and fabricate a driving circuit. Moreover, since a deposition apparatus and an encapsulation apparatus are all that is needed for fabricating the OLED display device, the fabrication process for the OLED display device is very simple.

FIG. 1 is a plan view showing an organic light emitting diode display device according to the related art. In FIG. 1, an organic light emitting diode (OLED) display device 10 according to the related art includes first, second and third sub-pixels SP1, SP2 and SP3 arranged in a stripe type. The first sub-pixels SP1 emitting a red colored light are arranged in a first stripe S1 along a vertical direction, the second sub-pixels SP2 emitting a green colored light are arranged in a second stripe S2 along the vertical direction, and the third sub-pixels SP3 emitting a blue-colored light are arranged in a third stripe S3 along the vertical direction. In addition, the first, second and third sub-pixels SP1, SP2 and SP3 are sequentially arranged along a horizontal direction. The first, second and third sub-pixels SP1, SP2 and SP3 constitute a single pixel P.

An organic luminescent layer is formed in each of the first, second and third sub-pixels SP1, SP2 and SP3 by depositing an organic luminescent material using a shadow mask having an opening and a rib surrounding the opening. The organic luminescent materials in the first, second and third sub-pixels SP1, SP2 and SP3 are divided by the shadow mask and the luminescent property of the organic luminescent material is improved by the shadow mask.

The OLED display device is classified into a top emission type and a bottom emission type according to an emission direction of light. Since an aperture ratio of the top emission type OLED display device is greater than an aperture ratio of the bottom emission type OLED display device, the top emission type OLED display device has been widely used. However, since the shadow mask for the top emission type OLED display device has the opening having a relatively great area and the rib having a relatively narrow width. As a result, when the organic luminescent material is deposited by using the shadow mask, the shadow mask is deteriorated. For example, the opening of the shadow mask is blocked by the organic luminescent material such that the area of the opening is reduced and the adjacent ribs contact each other.

The organic luminescent layer may be formed as a multiple layer including a hole injecting layer, a hole transporting layer, an emitting material layer and an electron transporting layer. Specifically, the hole transporting layers of the first, second and third sub-pixels have different thicknesses from each other.

FIG. 2 is a cross-sectional view showing an organic light emitting diode display device according to the related art. In FIG. 2, the organic light emitting diode display device 10 according to the related art includes the pixel P, and the pixel P includes the first, second and third sub-pixels SP1, SP2 and SP3 corresponding to red, green and blue colors, respectively. An organic light emitting diode in each of the first, second and third sub-pixels SP1, SP2 and SP3 includes a first electrode 11, a hole injecting layer (HIL) 13, a hole transporting layer (HTL) 16, an emitting material layer (EML) 24, an electron transporting layer (ETL) 30 and a second electrode 35.

The hole transporting layer 16 includes first, second and third hole transporting layers 16a, 16b and 16c, and the emitting material layer 24 includes first, second and third emitting material layers 24a, 24b and 24c emitting red, green and blue colored lights, respectively. The first hole transporting layer 16a is formed in the entire pixel P with an equal thickness. The second and third hole transporting layers 16b and 16c are formed in the first and second sub-pixels SP1 and SP2, respectively, with different thicknesses. As a result, the first and second hole transporting layers 16a and 16b of the first sub-pixel SP1, the first and third hole transporting layers 16a and 16c of the second sub-pixel SP2 and the first hole transporting layer 16a of the third sub-pixel SP3 have different thicknesses from each other.

The first, second and third emitting material layers 24a, 24b and 24c have different luminous efficiencies from each other. The thickness of the hole transporting layer 16 in each of the first, second and third sub-pixels SP1, SP2 and SP3 is determined based on an optical thickness for maximizing a micro cavity effect according to the luminous efficiency of each of the first, second and third emitting material layers 24a, 24b and 24c.

The hole injecting layer 13 and the first hole transporting layer 16a are sequentially formed on the first electrode 11 by using a first shadow mask having a first opening corresponding to the entire pixel P. Next, the third hole transporting layer 16c is formed on the first hole transporting layer 16a by using a second shadow mask having a second opening corresponding to the second sub-pixel SP2, and the second hole transporting layer 16b is formed on the first hole transporting layer 16a by using a third shadow mask having a third opening corresponding to the first sub-pixel SP1. Next, the third emitting material layers 24c is formed on the first hole transporting layer 16a by using a fourth shadow mask having a fourth opening corresponding to the third sub-pixel SP3, and the second emitting material layers 24b is formed on the third hole transporting layer 16c by using a fifth shadow mask having a fifth opening corresponding to the second sub-pixel SP2. In addition, the first emitting material layers 24a is formed on the second hole transporting layer 16b by using a sixth shadow mask having a sixth opening corresponding to the first sub-pixel SP1. Next, the electron transporting layer 30 is formed on the first, second and third emitting material layers 24a, 24b and 24c by using a seventh shadow mask having a seventh opening corresponding to the entire pixel P, and the second electrode 35 is formed on the electron transporting layer 30.

In the organic light emitting diode display device according to the related art, since the second and third hole transporting layers 16b and 16c are further formed in the first and second sub-pixels SP1 and SP2, respectively, the more organic luminescent material is used for the organic luminescent layer and the material cost increases. In addition, since the organic luminescent material has different heat capacities, different melting points and different boiling points, the organic luminescent material may remains on the shadow mask to reduce the area of the opening such that the adjacent ribs contact each other after the organic luminescent material is deposited by using the shadow mask. The blocking of the opening (i.e. the rib contact) of the shadow mask causes deterioration of patterns in a subsequent depositing step.

FIG. 3 is a plan view showing a shadow mask used for forming a sub-pixel of an organic light emitting diode display device according to the related art, and FIG. 4 is a phase diagram for an organic luminescent material used for an organic light emitting diode display device according to the related art. In FIG. 3, a shadow mask 50 includes an opening OP of a rectangular shape and a rib RB surrounding the opening OP before the shadow mask 50 is used for depositing an organic luminescent material. However, after the shadow mask 50 is used for depositing an organic luminescent material several times to form the second and third hole transporting layers 16b and 16c (of FIG. 2), the organic luminescent material remains on the shadow mask 50 and the opening OP is blocked by the residual organic luminescent material such that the adjacent rib RB contact each other.

The rib contact deterioration of the shadow mask 50 relates to physical properties such as a heat capacity, a melting point and a boiling point in a material point of view. In a vacuum thermal evaporation process, molecules of the organic luminescent material are evaporated to be a gas state and are deposited on a substrate. In FIG. 4, the organic luminescent material transitions along an arrow (A) from a solid state to a gas state through a liquid state under a first process pressure P1, and the organic luminescent material of the gas state is deposited on the substrate. Before the gas state of the molecules of the organic luminescent material becomes a complete inactive state (i.e. the solid state) on the substrate, the molecules of the organic luminescent material have an active state (i.e. the liquid state) as an intermediate state for a temperature period TPA. Since the molecules of an active state have an attractive force therebetween due to a physical reaction instead of a chemical reaction, a tensile force the molecules of an active state increases so that the molecules of an active state can perform a gelatination.

Since the adjacent ribs RB of the shadow mask 50 are relatively close to each other, a portion of the molecules of an active state adheres to the rib RB due to a physical reaction while the shadow mask 50 is aligned to the substrate. As the vacuum thermal evaporation process is repeated, an amount of the molecules adhering to the rib RB increases so that the adjacent ribs RB can contact each other.

BRIEF SUMMARY

A method of forming an organic luminescent layer includes: sequentially disposing a shadow mask and a substrate over disposing at least one crucible having first and second organic materials therein; and heating up the first and second organic materials to form the organic luminescent layer on the substrate, wherein the second organic material has one of a heat capacity smaller than the first organic material and a sublimableness.

In another aspect, a method of fabricating an organic light emitting diode display device includes: forming a gate line, a data line, a power line, a switching thin film transistor and a driving thin film transistor on a first substrate, the switching thin film transistor connected to the gate line and the data line, and the driving thin film transistor connected to the switching thin film transistor and the power line; forming a first electrode connected to the driving thin film transistor; forming an organic luminescent layer on the first electrode by evaporating first and second organic materials through a shadow mask, the second organic material having one of a heat capacity smaller than the first organic material and a sublimableness; forming a second electrode on the organic luminescent layer, the first electrode, the organic luminescent layer and the second electrode constituting an organic light emitting diode; and forming a second substrate to the first substrate having the organic light emitting diode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE DRAWINGS AND THE PRESENTLY PREFERRED EMBODIMENTS

Reference will now be made in detail to the preferred embodiments, examples of which are illustrated in the accompanying drawings.

Figure 1:
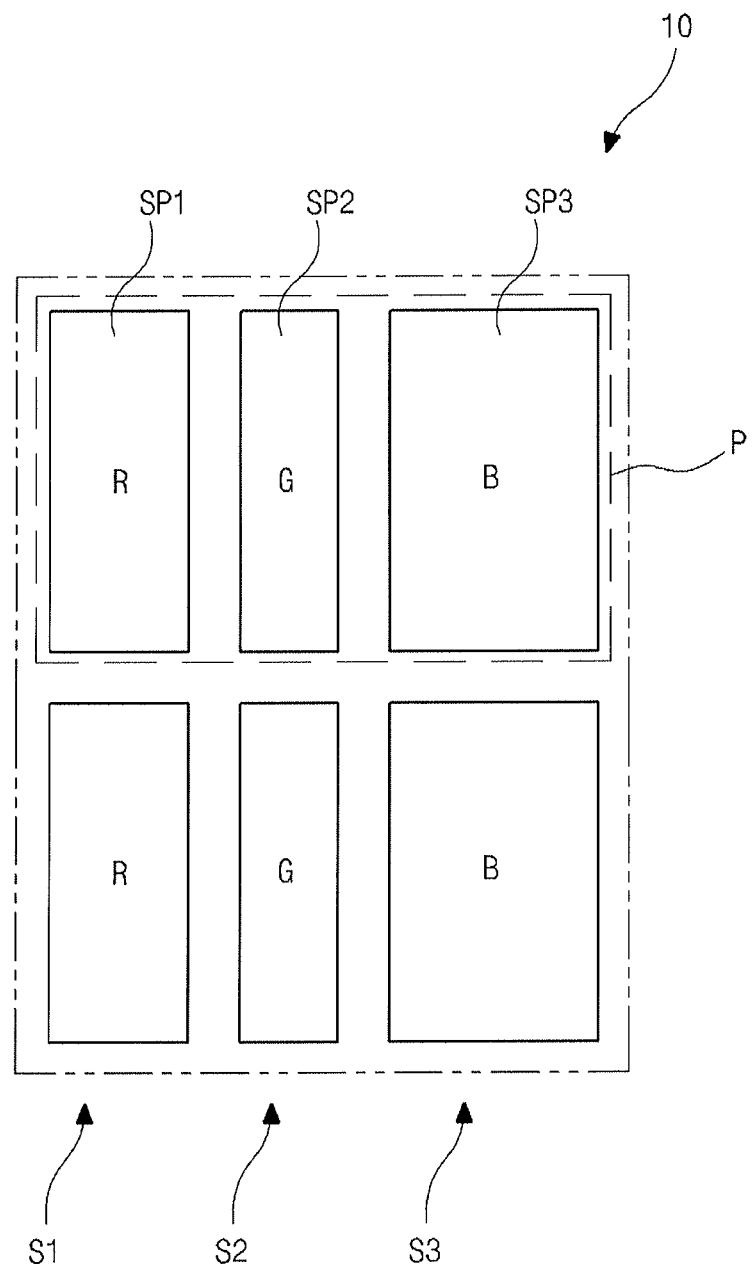
FIG. 1 is a plan view showing an organic light emitting diode display device according to the related art.
Figure 2:
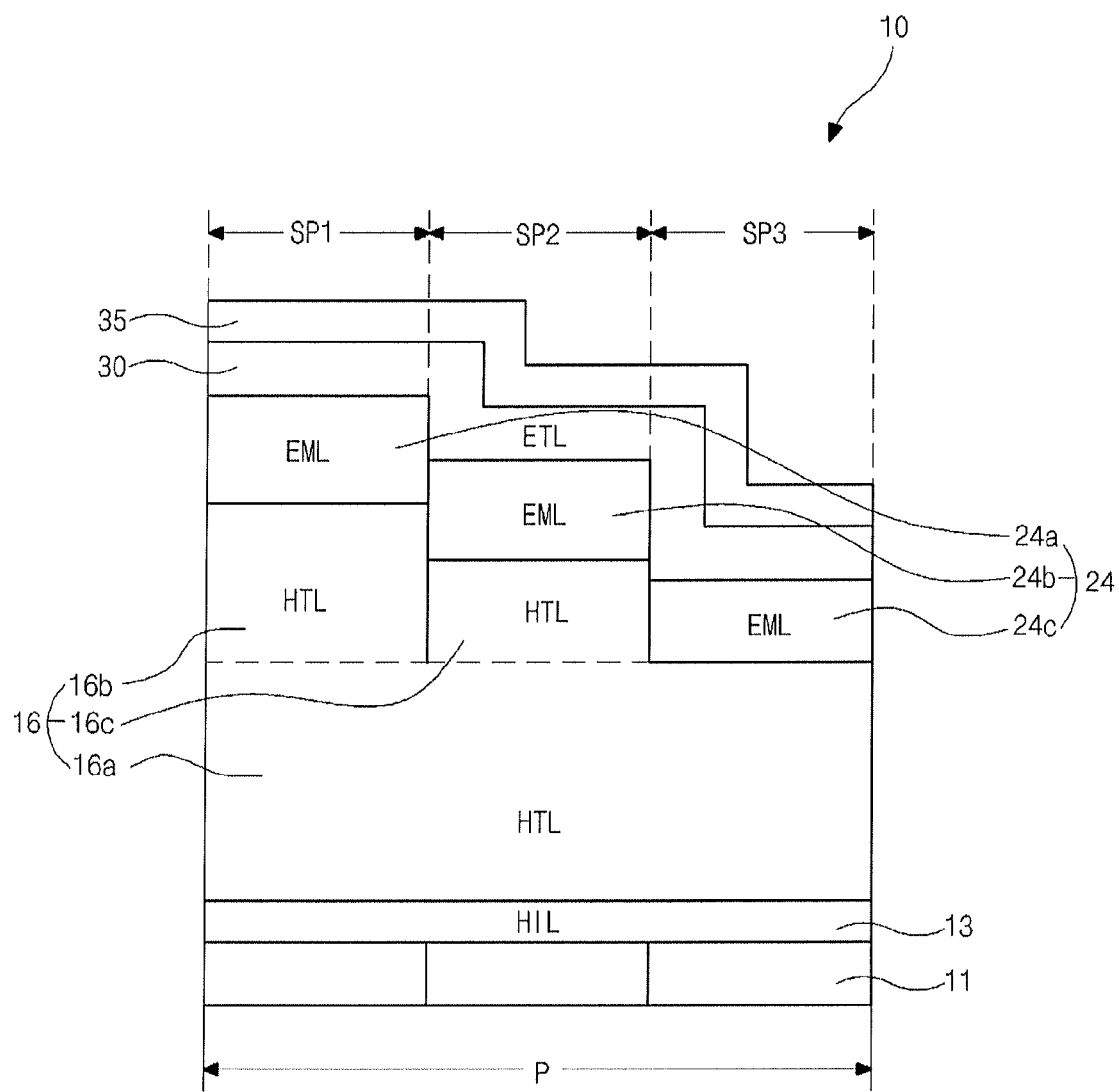
FIG. 2 is a cross-sectional view showing an organic light emitting diode display device according to the related art.
Figure 3:
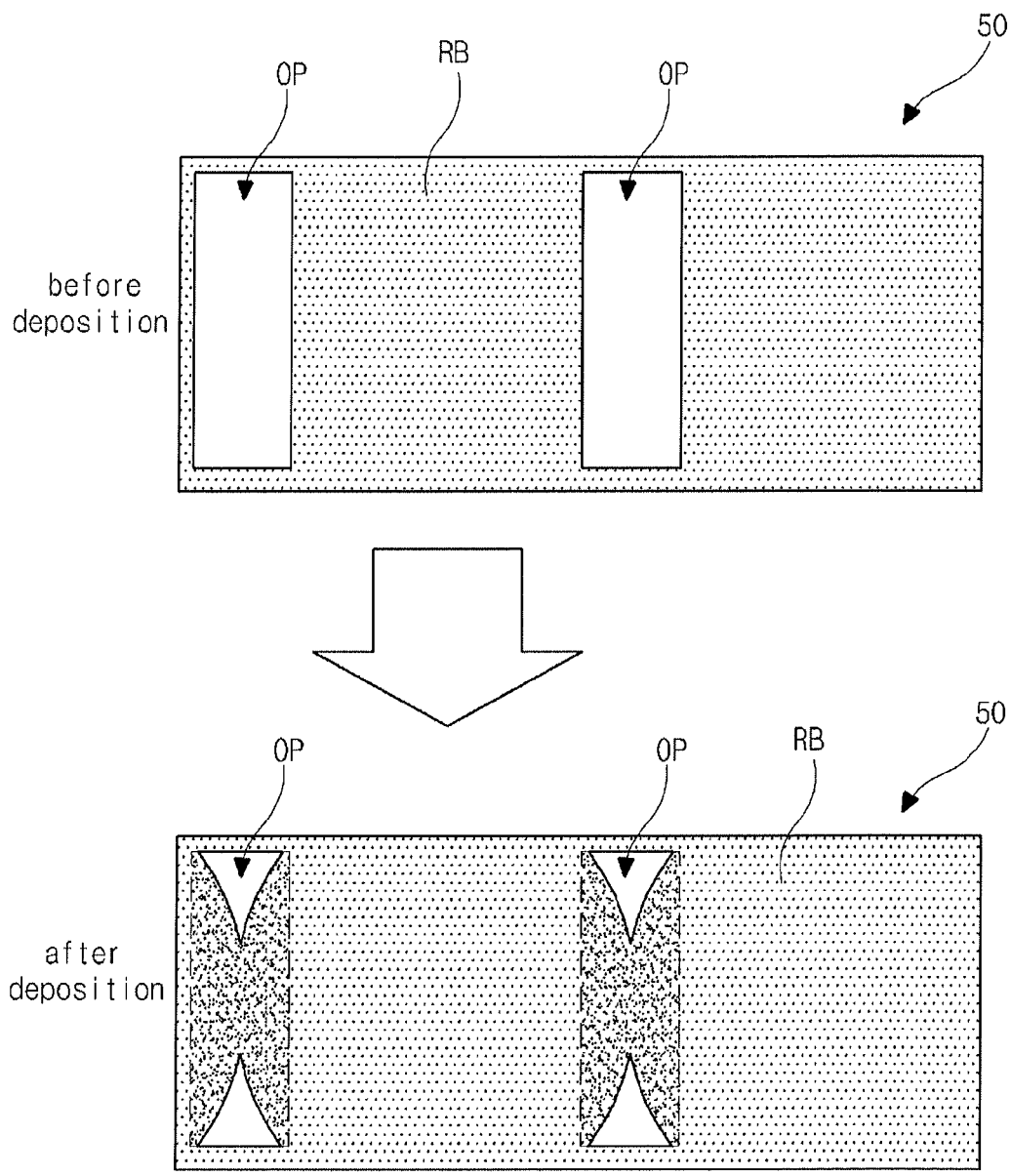
FIG. 3 is a plan view showing a shadow mask used for forming a sub-pixel of an organic light emitting diode display device according to the related art.
Figure 4:
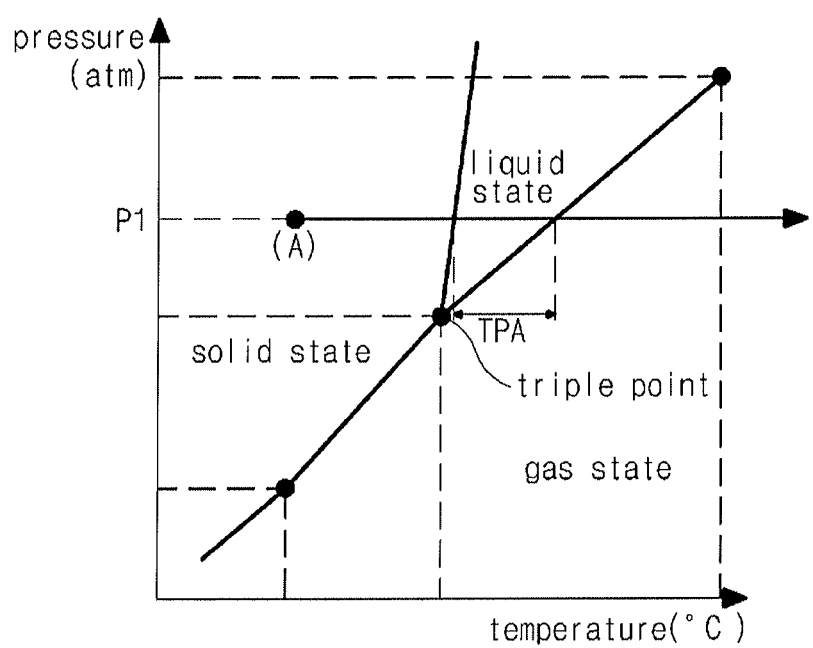
FIG. 4 is a phase diagram for an organic luminescent material used for an organic light emitting diode display device according to the related art.
Figure 5:
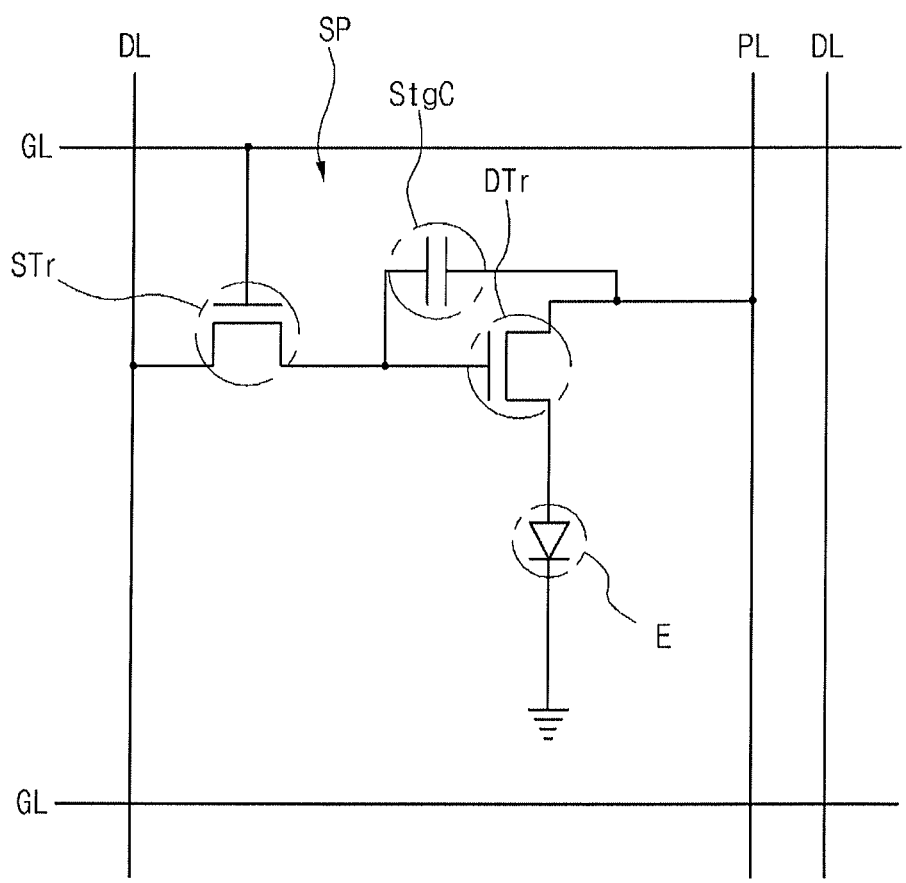
FIG. 5 is a circuit diagram showing a sub-pixel of an organic light emitting diode display device according to an embodiment of the present invention.

FIG. 5 is a circuit diagram showing a sub-pixel of an organic light emitting diode display device according to an embodiment of the present invention.

In FIG. 5, a sub-pixel SP of an organic light emitting diode (OLED) display device includes a switching thin film transistor (TFT) STr, a driving TFT DTr, a storage capacitor StgC and an organic light emitting diode E. A gate line GL is formed along a first direction, and a data line DL is formed along a second direction. The gate line GL and the data line DL cross each other to define the sub-pixel SP. A power line PL is formed to be spaced apart from the data line DL for supplying a source power.

The switching TFT STr is connected to the gate line GL and the data line DL, and the driving TFT DTr is connected to the switching TFT STr. In addition, the organic light emitting diode E is connected to the driving TFT DTr. For example, a first electrode of the organic light emitting diode E may be connected to a drain electrode of the driving TFT DTr and a second electrode of the organic light emitting diode E may be connected to the power line PL such that the source power of the power line PL is supplied to the organic light emitting diode E. Further, the storage capacitor StgC is connected between gate and source electrodes of the driving TFT DTr.

When a gate pulse of a gate signal is applied to the switching TFT STr through the gate line GL, the switching TFT STr is turned on and a data signal is applied to the gate electrode of the driving TFT DTr through the data line DL and the switching TFT STr. As a result, the driving TFT DTr is turned on and the source power is applied to the organic light emitting diode E through the power line PL and the driving TFT DTr so that the organic light emitting diode E can emit a light.

While the switching TFT STr is turned on, a magnitude of a current flowing from the power line PL to the organic light emitting diode E is determined according to a magnitude of a gate voltage of the driving TFT DTr. As a result, the organic light emitting diode E can display a gray scale. While the switching TFT STr is turned off, the storage capacitor StgC maintains the gate voltage of the driving TFT DTr. As a result, the magnitude of the current flowing through the light emitting diode E is kept uniform until the next frame even when the switching TFT STr is turned off.

Figure 6:
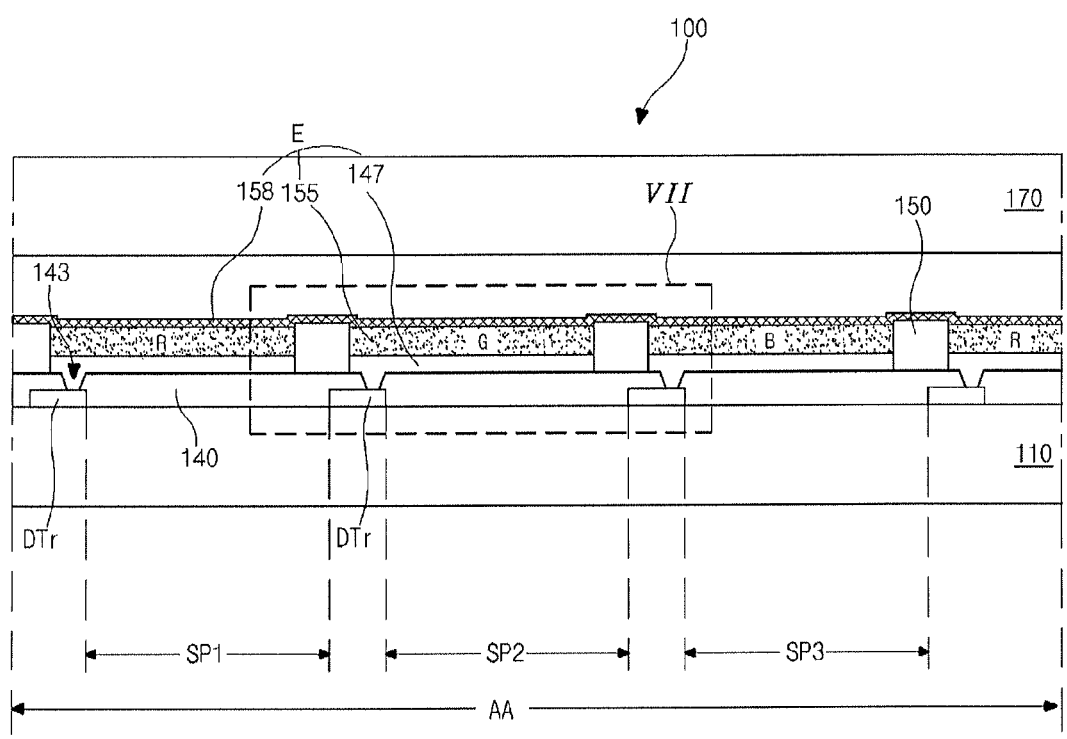
FIG. 6 is a cross-sectional view showing an organic light emitting diode display device according to an embodiment of the present invention.
Figure 7:
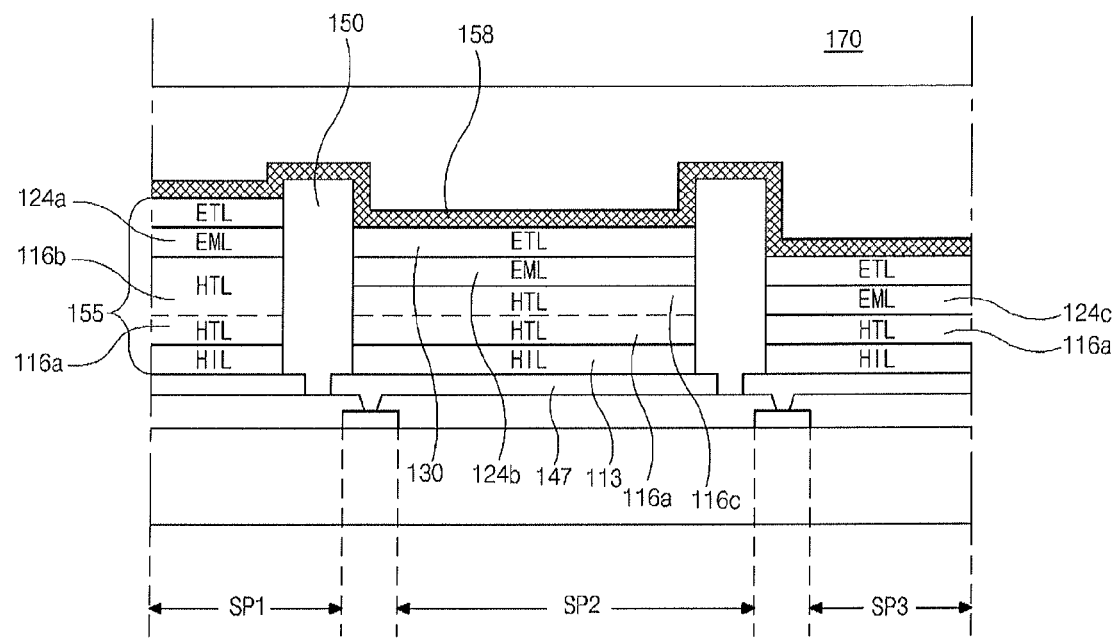
FIG. 7 is a magnified cross-sectional view showing a portion VII of FIG. 6.

FIG. 6 is a cross-sectional view showing an organic light emitting diode display device according to an embodiment of the present invention, and FIG. 7 is a magnified cross-sectional view showing a portion VII of FIG. 6.

In FIG. 6, an organic light emitting diode (OLED) display device 100 includes first and second substrates 110 and 170 facing and spaced apart from each other. The first substrate 110 includes a display area AA for displaying images and a non-display area (not shown) surrounding the display area AA. The display area AA includes first, second and third sub-pixels SP1, SP2 and SP3 each defined by a gate line GL (of FIG. 5) and a data line DL (of FIG. 5). A power line PL (of FIG. 5) may be formed to be parallel to and spaced apart from the data line DL. A switching thin film transistor (TFT) STr (of FIG. 5) and a driving TFT DTr are formed in each of the first, second and third sub-pixels SP1, SP2 and SP3, and a first electrode 147 is formed in each of the first, second and third sub-pixels SP1, SP2 and SP3 to be connected to the driving TFT DTr.

In addition, an organic luminescent layer 155 is formed on the first electrode 147 and a second electrode 158 is formed on the organic luminescent layer 155. The organic luminescent layers 155 of the first, second and third sub-pixels SP1, SP2 and SP3 may correspond to red, green and blue colors, respectively. The first electrode 147, the organic luminescent layer 155 and the second electrode 158 constitute an organic light emitting diode E. A bank layer 150 is formed on a boundary portion of the first electrode 147 such that the organic luminescent layers 155 of the adjacent sub-pixels are separated by the bank layer 150.

The second substrate 170 may be used for encapsulating the first substrate 110. In addition, a seal pattern or a frit pattern may be formed between the first and second substrates 110 and 170 in the non-display area for attaching the first and second substrates 110 and 170. For the purpose that an interior of the first and second substrates 110 and 170 is not exposed to a moisture or an atmosphere, the first and second substrates 110 and 170 may be attached in an inert gas ambience or a vacuum ambience by using the seal pattern or the frit pattern.

Although the organic light emitting diode E of the first substrate 110 is encapsulated by the second substrate 170 in FIG. 5, a transparent film or an encapsulation film of one of organic and inorganic materials may be formed over the organic light emitting diode E for encapsulation in another embodiment.

In FIG. 6, the organic luminescent layer 155 between the first and second electrodes 147 and 158 includes a hole injecting layer (HIL) 113, a hole transporting layer (HTL) 116a, 116b and 116c, an emitting material layer (EML) 124a, 124b and 124c and an electron transporting layer (ETL) 130. For example, the organic luminescent layer 155 in the first sub-pixel SP1 may include the hole injecting layer 113, the first and second hole transporting layers 116a and 116b, the first emitting material layer 124a and the electron transporting layer 130. In addition, the organic luminescent layer 155 in the second sub-pixel SP2 may include the hole injecting layer 113, the first and third hole transporting layers 116a and 116c, the second emitting material layer 124b and the electron transporting layer 130, and the organic luminescent layer 155 in the third sub-pixel SP3 may include the hole injecting layer 113, the first hole transporting layer 116a, the second emitting material layer 124b and the electron transporting layer 130.

The organic luminescent layer 155 may further include an electron injecting layer (EIL) on the electron transporting layer 130 in another embodiment. The first, second and third emitting material layers 124a, 124b and 124c may emit red, green and blue colored lights, respectively. The first hole transporting layers 116a of the first, second and third sub-pixels SP1, SP2 and SP3 may have an equal thickness. The second hole transporting layer 116b of the first sub-pixel SP1 and the third hole transporting layer 116c of the second sub-pixel SP2 may have different thicknesses from each other. As a result, the first and second hole transporting layers 116a and 116b of the first sub-pixel SP1, the first and third hole transporting layers 116a and 116c of the second sub-pixel SP2 and the first hole transporting layer 116a of the third sub-pixel SP3 may have different thicknesses from each other.

The first, second and third emitting material layers 124a, 124b and 124c may have different luminous efficiencies from each other. The thickness of each of the first and second hole transporting layers 116a and 116b of the first sub-pixel SP1, the first and third hole transporting layers 116a and 116c of the second sub-pixel SP2 and the first hole transporting layer 116a of the third sub-pixel SP3 may be determined based on an optical thickness for maximizing a micro cavity effect according to the luminous efficiency of each of the first, second and third emitting material layers 124a, 124b and 124c.

A method of forming the organic luminescent layer 155 will be illustrated hereinafter. The hole injecting layer 113 and the first hole transporting layer 116a are sequentially formed on the first electrode 147 through a vacuum thermal evaporation process using a first shadow mask having a first opening corresponding to the first, second and third sub-pixels SP1, SP2 and SP3. For example, the first hole transporting layer 116a may be formed of a first organic material for transporting a hole and a second organic material for preventing the rib contact of the shadow mask. Next, the third hole transporting layer 116c is formed on the first hole transporting layer 116a through the vacuum thermal evaporation process using a second shadow mask having a second opening corresponding to the second sub-pixel SP2, and the second hole transporting layer 116b is formed on the first hole transporting layer 116a through the vacuum thermal evaporation process using a third shadow mask having a third opening corresponding to the first sub-pixel SP1. For example, at least one of the second and third hole transporting layers 116b and 116c may be formed of the first organic material for transporting a hole and a second organic material for preventing the rib contact of the shadow mask.

Next, the third emitting material layers 124c is formed on the first hole transporting layer 116a through the vacuum thermal evaporation process using a fourth shadow mask having a fourth opening corresponding to the third sub-pixel SP3, and the second emitting material layers 124b is formed on the third hole transporting layer 116c through the vacuum thermal evaporation process using a fifth shadow mask having a fifth opening corresponding to the second sub-pixel SP2. In addition, the first emitting material layers 124a is formed on the second hole transporting layer 116b through the vacuum thermal evaporation process using a sixth shadow mask having a sixth opening corresponding to the first sub-pixel SP1. Next, the electron transporting layer 130 is formed on the first, second and third emitting material layers 124a, 124b and 124c through the vacuum thermal evaporation process using a seventh shadow mask having a seventh opening corresponding to the first, second and third sub-pixels SP1, SP2 and SP3.

In the OLED display device 100, the organic luminescent layer 155 may be formed through a vacuum thermal evaporation process using a shadow mask. Specifically, at least one of the first, second and third hole transporting layers 116a, 116b and 116c may be formed by depositing the first organic material for transporting a hole and the second organic material for preventing the rib contact of the shadow mask through the vacuum thermal evaporation process. The second organic material for preventing the rib contact may have a relatively low heat capacity and a relatively high melting point in a liquid state or have a sublimableness at a process pressure. Since the second organic material prevents the first organic material in an active state from physically reacting, a tensile force is reduced and a gelatination is prevented so that deterioration of the shadow mask such as the rib contact can be prevented. Further, the second organic material may be used as a host of at least one of the first, second and third emitting material layers 124a, 124b and 124c.

Figure 8:
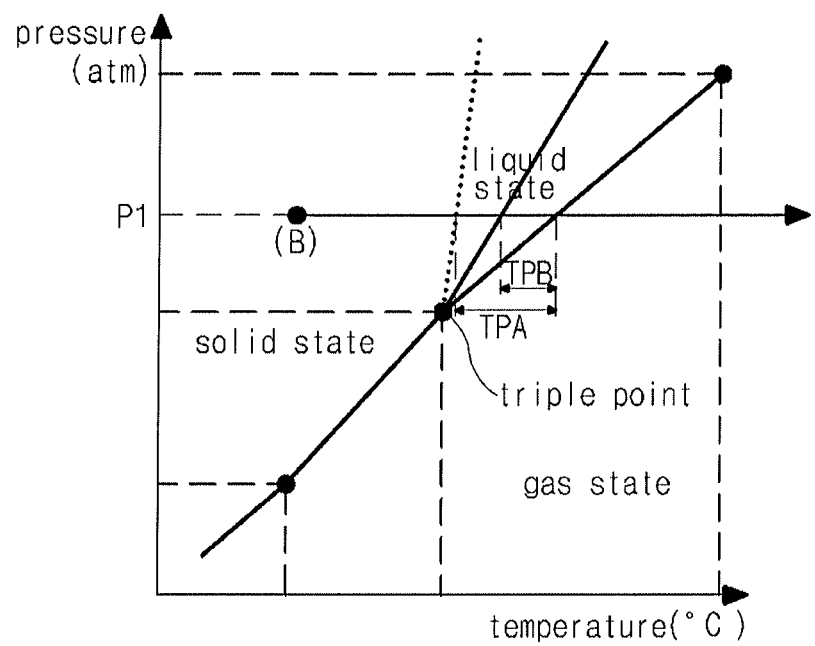
FIG. 8 is a phase diagram for first and second organic materials used for an organic light emitting diode display device according to an embodiment of the present invention.
Figure 9:
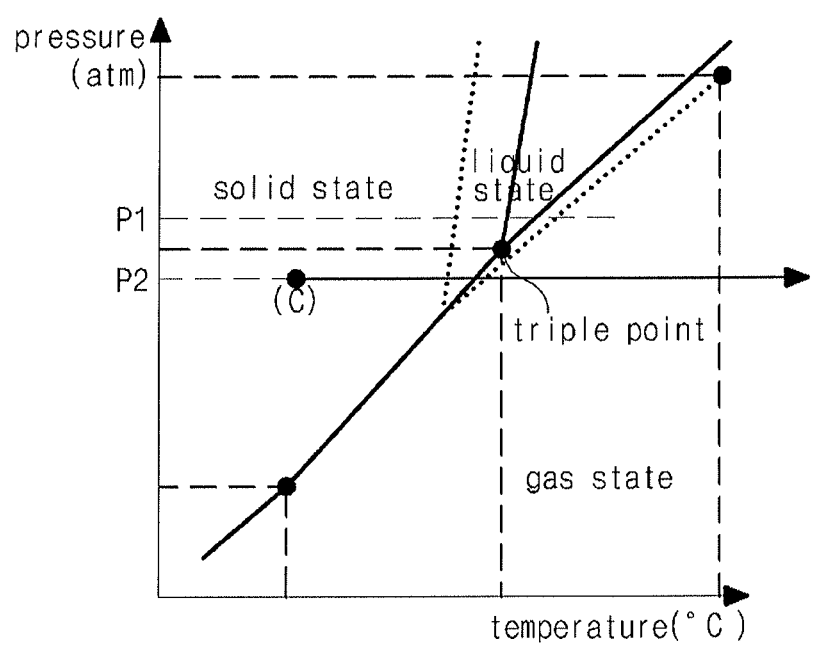
FIG. 9 is a phase diagram for first and second organic materials used for an organic light emitting diode display device according to another embodiment of the present invention.

FIG. 8 is a phase diagram for first and second organic materials used for an organic light emitting diode display device according to an embodiment of the present invention, and FIG. 9 is a phase diagram for first and second organic materials used for an organic light emitting diode display device according to another embodiment of the present invention. In FIGS. 8 and 9, the broken line represents a border line between states of the first organic material and the unbroken line represents a border line between states of the second organic material.

In FIG. 8, first and second organic materials transition along an arrow (B) from a solid state to a gas state through a liquid state under a first process pressure P1 during a vacuum thermal evaporation process, and the first and second organic materials of the gas state are deposited on a substrate. Before the gas state of the molecules of the first and second organic materials becomes a complete inactive state (i.e. the solid state) on the substrate, the molecules of the first organic material have an active state (i.e. the liquid state) as an intermediate state for a first temperature period TPA and the molecules of the second organic material have an active state (i.e. the liquid state) as an intermediate state for a second temperature period TPB shorter than the first temperature period TPA. Each of the first and second temperature periods TPA and TPB may be defined as a period where an entropy of a molecule in a liquid state increases or decreases by heat absorption or heat dissipation. As a molecule has a wider temperature period, the molecule has a higher heat capacity. In addition, when a boiling point is fixed, as a molecule has a higher heat capacity, the molecule has a lower melting point. Further, as a molecule has a lower heat capacity, the molecule more easily transitions to an inactive state (i.e. the solid state).

The first organic material having the first temperature period TPA has a first heat capacity and the second organic material having the second temperature period TPB has a second heat capacity smaller than the first heat capacity. Since the first organic material has electric property and stability for transporting a hole, at least one of the first, second and third hole transporting layers 116a, 116b and 116c formed of the first organic material may perform a function of transporting a hole. In addition, since the first organic material is deposited together with the second organic material, deterioration of a shadow mask such as the rib contact due to the first organic material having the greater heat capacity is prevented by the second organic material having the smaller heat capacity. Although the first organic material has the active state, the second organic material prevents the first organic material from physically reacting because the second organic material having the inactive state is mixed with the first organic material having the active state. As a result, a tensile force is reduced and a gelatination is prevented so that deterioration of the shadow mask such as the rib contact can be prevented.

For example, the first organic material may include one of TPD (N,N'-bis-(3-methylphenyl)-N,N'-bis-(phenyl)-benzidine), s-TAD (2,2',7,7'-tetrakis-(diphenyl-amino)spiro-9,9'-bifluorene), MTDATA (4,4',4"-tris(N-3-methylphenyl-N-phenyl-amino)-triphenylamine), PEDOT (poly(3,4-ethylene dioxy-2,4-thiophene)) and PANI (polyaniline). In addition, the second organic material may include arylamine derivatives and a melting point of the second organic material may be higher than a melting point of the first organic material. For example, the second organic material may include one of NPD (N,N-dinaphthyl-N,N'-diphenylbenzidine), biphenyl-diamine derivative, starburst type material, spiro type material, coumarin-based compound, quinacridone-based compound. Further, the second organic material may have a melting point equal to or higher than about 280° C. at 1 atm.

The second organic material having the smaller heat capacity for at least one of the first, second and third hole transporting layers 116a, 116b and 116c may be used for the other layer of the organic luminescent layer 155. For example, the second organic material having the smaller heat capacity may be used as a source material for at least one of the hole injecting layer 113, the first, second and third emitting material layers 124a, 124b and 124c, the electron transporting layer 130 and the electron injecting layer.

In FIG. 9, during a vacuum thermal evaporation process, a first organic material transitions along an arrow (C) from a solid state to a gas state through a liquid state under a second process pressure P2, and a second organic material transitions along the arrow (C) from the solid state directly to the gas state under the second process pressure P2. The second process pressure P2 may be lower than the first process pressure P1 (of FIG. 8). The first and second organic materials of the gas state are deposited on a substrate. Since the second organic material transitions from the solid state to the gas state without through the liquid state, the second organic material has a sublimableness. The molecules of the first organic material have an active state (i.e. the liquid state) as an intermediate state for a temperature period TPA before the gas state of the molecules of the first organic material becomes a complete inactive state (i.e. the solid state) on the substrate, while the molecules of the second organic material transition from the gas state directly to the complete inactive state (i.e. the solid state) without an active state (i.e. the liquid state).

Since the first organic material has electric property and stability for transporting a hole, at least one of the first, second and third hole transporting layers 116a, 116b and 116c formed of the first organic material may perform a function of transporting a hole. In addition, since the first organic material is deposited together with the second organic material, deterioration of a shadow mask such as the rib contact due to the first organic material having the intermediate active state is prevented by the second organic material having the sublimableness. Although the first organic material has the active state, the second organic material prevents the first organic material from physically reacting because the second organic material having the inactive state is mixed with the first organic material having the active state. As a result, a tensile force is reduced and a gelatination is prevented so that deterioration of the shadow mask such as the rib contact can be prevented.

For example, the first organic material may include one of TPD (N,N'-bis-(3-methylphenyl)-N,N'-bis-(phenyl)-benzidine), s-TAD (2,2',7,7'-tetrakis-(diphenyl-amino)spiro-9,9'-bifluorene), MTDATA (4,4',4''-tris(N-3-methylphenyl-N-phenyl-amino)-triphenylamine), PEDOT (poly(3,4-ethylene dioxy-2,4-thiophene)) and PANI (polyaniline). In addition, the second organic material may include arylamine derivatives and a melting point of the second organic material may be higher than a melting point of the first organic material. For example, the second organic material may include one of NPD (N,N-dinaphthyl-N,N'-diphenylbenzidine), biphenyldiamine derivative, starburst type material, spiro type material, coumarin-based compound, quinacridone-based compound. Further, the second organic material may have a sublimableness at a pressure equal to or lower than about 5×10-6 torr.

The second organic material having the sublimableness for at least one of the first, second and third hole transporting layers 116a, 116b and 116c may be used for the other layer of the organic luminescent layer 155. For example, the second organic material having the sublimableness may be used as a source material for at least one of the hole injecting layer 113, the first, second and third emitting material layers 124a, 124b and 124c, the electron transporting layer 130 and the electron injecting layer.

Figure 10:
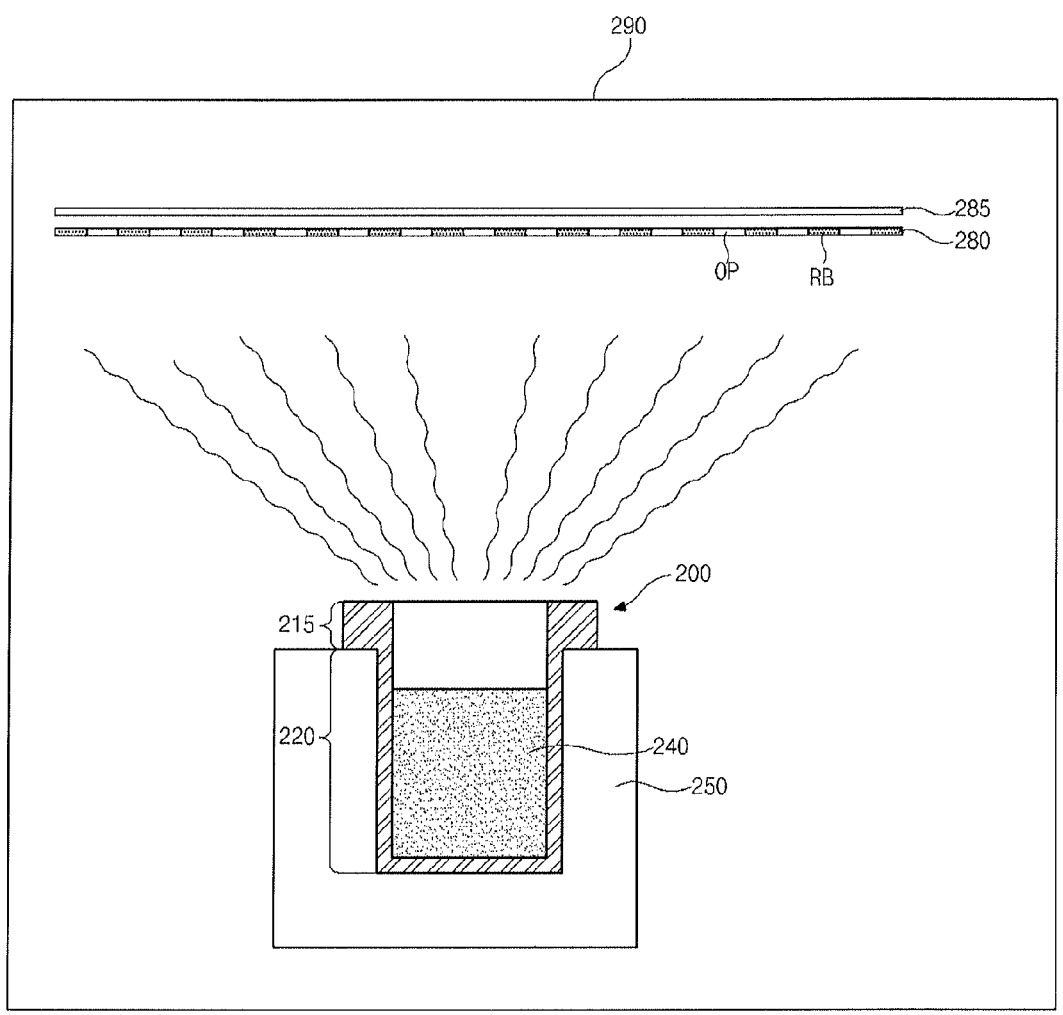
FIG. 10 is a cross-sectional view showing a vacuum thermal evaporation process for an organic light emitting diode display device according to an embodiment of the present invention.

FIG. 10 is a cross-sectional view showing a vacuum thermal evaporation process for an organic light emitting diode display device according to an embodiment of the present invention.

In FIG. 10, a crucible 200, a heater 250, a shadow mask 280 and a substrate 285 are disposed in a chamber 290 of a vacuum thermal evaporation apparatus. The crucible 200 includes a body 220 of a cylindrical shape and a gas outlet 215. The crucible 200 is disposed on the heater 250, and the shadow mask 280 and the substrate 285 are disposed over the crucible 200. A source material 240 including first and second organic materials is disposed in the body 220. The first organic material for transporting for transporting a hole may include one of TPD (N,N'-bis-(3-methylphenyl)-N,N'-bis-(phenyl)-benzidine), s-TAD (2,2',7,7'-tetrakis-(diphenyl-amino)spiro-9,9'-bifluorene), MTDATA (4,4',4''-tris(N-3-methylphenyl-N-phenyl-amino)-triphenylamine), PEDOT (poly(3,4-ethylene dioxy-2,4-thiophene)) and PANI (polyaniline). In addition, the second organic material for preventing the rib contact may include one of NPD (N,N-dinaphthyl-N,N'-diphenylbenzidine), biphenyldiamine derivative, starburst type material, spiro type material, coumarin-based compound, quinacridone-based compound.

When the heater 250 heats up the body 220 of the crucible 200, a heat is transmitted to the source material 240 in the body 220 and the source material 240 is heated up to evaporate. The source material 240 of the gas state is outputted through the gas outlet 215 of the crucible 200 and is selectively deposited on the substrate 285 through the shadow mask 280. The source material 240 of the gas state deposited on the substrate 285 loses the heat and is solidified to form a hole transporting layer (not shown) on the substrate 285.

Since the source material 240 includes the first organic material that has electric property and stability for transporting a hole and the second organic material having one of the smaller heat capacity and the sublimableness, the hole transporting layer performs a function of transporting a hole and deterioration of the shadow mask 280 such as the rib contact is prevented.

After the vacuum thermal evaporation process for the organic luminescent layer is finished, a second electrode is formed on the organic luminescent layer and one of a capping film and a second substrate is formed over an organic light emitting diode to complete an organic light emitting diode display device.

Although the source material including the first and second organic materials is disposed in the single crucible in FIG. 10, the first and second organic materials may be disposed in first and second crucibles, respectively, in another embodiment.

Consequently, in a method of fabricating an organic light emitting diode display device of the present disclosure, since an organic luminescent layer of an organic light emitting diode is formed of a first organic material for transporting a hole and a second organic material having one of a smaller heat capacity and a sublimableness through a vacuum thermal evaporation process, a gelatination of the organic material is prevented so that deterioration of a shadow mask such as a rib contact can be prevented. In addition, since deterioration of the shadow mask is prevented, a yield is improved. Further, since a time for cleaning the shadow mask is reduced, productivity is improved.

It will be apparent to those skilled in the art that various modifications and variations can be made in a method of fabricating an organic light emitting diode display device of the present disclosure without departing from the sprit or scope of the invention. Thus, it is intended that the present invention covers the modifications and variations of this invention provided they come within the scope of the appended claims and their equivalents.

The invention claimed is:

1. A method of forming an organic luminescent layer, comprising:
sequentially disposing a shadow mask and a substrate over at least one crucible having first and second organic materials therein, the shadow mask defining at least one opening; and simultaneously depositing the first and second organic materials on the substrate through the at least one opening of the shadow mask by a vacuum thermal evaporation process;

wherein the second organic material has one of a heat capacity smaller than the first organic material and a sublimableness such that when the first and second organic materials are formed on the substrate, the second organic material completely transitions from one of a liquid state and a gas state to a solid state before the first organic material completely transitions from a liquid state to a solid state, and wherein the organic luminescent layer includes at least one of a hole injecting layer, a hole transporting layer, an emitting material layer, an electron transporting layer and an electron injecting layer.

2. The method according to claim 1, wherein the second organic material has the heat capacity smaller than the first organic material and has a melting point equal to or higher than about 280° C. at about 1 atm.

3. The method according to claim 1, wherein the second organic material has the sublimableness at a pressure equal to or lower than about 5×10-6 torr.

4. The method according to claim 1, wherein the second organic material includes one of NPD (N,N-dinaphthyl-N,N'-diphenylbenzidine), biphenyldiamine derivative, starburst type material, spiro type material, coumarin-based compound, quinacridone-based compound.

5. The method according to claim 1, wherein the organic luminescent layer is the hole transporting layer and the first organic material includes one of TPD (N,N'-bis-(3-methylphenyl)-N,N'-bis-(phenyl)-benzidine), s-TAD (2,2',7,7'-tetrakis-(diphenyl-amino)spiro-9,9'-bifluorene), MTDATA (4,4',4''-tris(N-3-methylphenyl-N-phenyl-amino)-triphenylamine), PEDOT (poly(3,4-ethylene dioxy-2,4-thiophene)) and PANI (polyaniline).

6. The method according to claim 1, wherein the at least one crucible is first and second crucibles having the first and second organic materials, respectively, therein.

7. A method of fabricating an organic light emitting diode display device, comprising:

forming a gate line, a data line, a power line, a switching thin film transistor and a driving thin film transistor on a first substrate, the switching thin film transistor connected to the gate line and the data line, and the driving thin film transistor connected to the switching thin film transistor and the power line;

forming a first electrode connected to the driving thin film transistor;

forming an organic luminescent layer on the first electrode by simultaneously evaporating first and second organic materials through a shadow mask, the second organic material having one of a heat capacity smaller than the first organic material and a sublimableness such that when the first and second organic materials are formed on the substrate, the second organic material completely transitions from one of a liquid state and a gas state to a solid state before the first organic material completely transitions from a liquid state to a solid state;

forming a second electrode on the organic luminescent layer, the first electrode, the organic luminescent layer and the second electrode constituting an organic light emitting diode; and forming a second substrate to the first substrate having the organic light emitting diode, and wherein the organic luminescent layer includes at least one of a hole injecting layer, a hole transporting layer, an emitting material layer, an electron transporting layer and an electron injecting layer.

8. The method according to claim 7, wherein the second organic material has the heat capacity smaller than the first organic material and has a melting point equal to or higher than about 280° C. at 1 atm.

9. The method according to claim 7, wherein the second organic material has the sublimableness at a pressure equal to or lower than about 5×10-6 torr.

10. The method according to claim 7, wherein the second organic material includes one of NPD (N,N-dinaphthyl-N,N'-diphenylbenzidine), biphenyldiamine derivative, starburst type material, spiro type material, coumarin-based compound, quinacridone-based compound.

11. The method according to claim 7, wherein the gate line and the data line cross each other to define first, second and third sub-pixels, wherein the organic luminescent layer in the first sub-pixel includes the hole injecting layer, a first hole transporting layer, a second hole transporting layer, a first emitting material layer, the electron transporting layer and the electron injecting layer, wherein the organic light emitting layer in the second sub-pixel includes the hole injecting layer, a third hole transporting layer, the emitting material layer, the electron transporting layer and the electron injecting layer, and wherein the organic luminescent layer in the third sub-pixel includes the hole injecting layer, the emitting material layer, the electron transporting layer and the electron injecting layer.

12. The method according to claim 11, wherein at least one of the first, second and third hole transporting layers are formed of the first organic material, which includes one of TPD (N,N'-bis-(3-methylphenyl)-N,N'-bis-(phenyl)-benzidine), s-TAD (2,2',7,7'-tetrakis-(diphenyl-amino)spiro-9,9'-bifluorene), MTDATA (4,4',4''-tris(N-3-methylphenyl-N-phenyl-amino)-triphenylamine), PEDOT (poly(3,4-ethylene dioxy-2,4-thiophene)) and PANI (polyaniline).

* * * * *